United States Patent
Li et al.

(10) Patent No.: US 10,031,161 B2
(45) Date of Patent: Jul. 24, 2018

(54) METHOD AND APPARATUS FOR RFID TAG TESTING

(71) Applicant: Taiwan Semiconductor Manufacturing Company, Ltd., Hsin-Chu (TW)

(72) Inventors: Tsung-Hsiung Li, New Taipei (TW); Kuang-Kai Yen, Kaohsiung (TW); Yi-Hsuan Liu, Hualien (TW); Hsieh-Hung Hsieh, Taipei (TW); Chewn-Pu Jou, Hsin-Chu (TW); Fu-Lung Hsueh, Kaohsiung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 84 days.

(21) Appl. No.: 15/065,530

(22) Filed: Mar. 9, 2016

(65) Prior Publication Data

US 2016/0187380 A1    Jun. 30, 2016

Related U.S. Application Data

(62) Division of application No. 13/655,047, filed on Oct. 18, 2012, now Pat. No. 9,304,164.

(60) Provisional application No. 61/693,127, filed on Aug. 24, 2012.

(51) Int. Cl.
| | |
|---|---|
| *G01R 1/067* | (2006.01) |
| *G01R 31/28* | (2006.01) |
| *G01R 31/26* | (2014.01) |
| *G01R 31/302* | (2006.01) |
| *G01R 31/3185* | (2006.01) |

(52) U.S. Cl.
CPC ...... *G01R 1/06711* (2013.01); *G01R 31/2607* (2013.01); *G01R 31/28* (2013.01); *G01R 31/3025* (2013.01); *G01R 31/318511* (2013.01)

(58) Field of Classification Search
None
See application file for complete search history.

(56) References Cited

U.S. PATENT DOCUMENTS

| | | | |
|---|---|---|---|
| 6,236,223 B1 * | 5/2001 | Brady | G01R 31/2822 324/750.3 |
| 6,346,881 B1 | 2/2002 | Davidson | |
| 7,307,528 B2 | 12/2007 | Glidden et al. | |
| 7,312,622 B2 | 12/2007 | Hyde et al. | |
| 7,400,255 B2 | 7/2008 | Horch | |
| 9,098,757 B2 * | 8/2015 | Lee | G01R 31/2656 |
| 9,304,164 B2 * | 4/2016 | Li | G01R 31/3025 |
| 2003/0235929 A1 * | 12/2003 | Cowles | G01R 31/2884 438/17 |
| 2006/0109120 A1 | 5/2006 | Burr et al. | |

(Continued)

*Primary Examiner* — Jermele M Hollington
(74) *Attorney, Agent, or Firm* — Slater Matsil, LLP

(57) ABSTRACT

A semiconductor wafer includes a plurality of dies and at least one test probe. Each of the plurality of dies includes a radio frequency identification (RFID) tag circuit. The at least one test probe includes a plurality of probe pads. The plurality of probe pads is configured to transmit power signals and data to each of the plurality of dies, and to receive test results from each of the plurality of dies. The data are transmitted to each of the plurality of dies in a serial manner. The test results of each of the plurality of dies are also transmitted to the plurality of probe pads in a serial manner.

20 Claims, 7 Drawing Sheets

(56) References Cited

U.S. PATENT DOCUMENTS

| | | |
|---|---|---|
| 2006/0125505 A1 | 6/2006 | Glidden et al. |
| 2006/0125506 A1 | 6/2006 | Hara et al. |
| 2006/0125507 A1 | 6/2006 | Hyde et al. |
| 2006/0276987 A1 | 12/2006 | Bolander et al. |
| 2007/0139057 A1 | 6/2007 | Nguyen et al. |
| 2009/0085589 A1 | 4/2009 | Hsieh et al. |
| 2009/0309609 A1 | 12/2009 | De Jong et al. |
| 2014/0145749 A1* | 5/2014 | Lee .................... G01R 31/2656 324/762.05 |
| 2014/0292490 A1 | 10/2014 | Butler et al. |

* cited by examiner

METHOD AND APPARATUS FOR RFID TAG TESTING

PRIORITY CLAIM AND CROSS-REFERENCE

This application is a divisional of U.S. application Ser. No. 13/655,047, filed on Oct. 18, 2012, entitled "Method and Apparatus of RFID Tag Testing," which claims the benefit of U.S. Provisional Application Ser. No. 61/693,127, filed on Aug. 24, 2012, entitled "Method and Apparatus of RFID Tag Testing," which applications are hereby incorporated herein by reference in their entireties.

TECHNICAL FIELD

The present disclosure is related to radio frequency identification (RFID) and, more particularly, to RFID tag wafer testing.

BACKGROUND

Radio frequency identification (RFID) tags are used increasingly in a wide variety of applications. For example, RFID tags are used in conjunction with security-locks in cars, for access control to buildings, for tracking inventory and parcels, etc.

RFID tags are used to associate an object with an identification code. RFID tags generally have a combination of antennas and analog and/or digital electronics, which may include, for example, communications electronics, data memory, control logics, etc.

RFID tags do not include a power source however. In order to retrieve information from a chip, a "base station" or "reader" sends an excitation signal to an RFID tag. The excitation signal energizes the RFID tag, and the RFID tag transmits the stored information back to the reader. The information includes environmental data, logistical histories, state data, etc. In general, RFID tags retain and transmit enough information to uniquely identify individuals, packages, inventory and the like.

One challenge associated with RFID tags is manufacturing and testing the RFID tags in a high-volume and cost-effective manner.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Making and using various embodiments of the disclosure are discussed in detail below. It should be appreciated, however, that the embodiments provide many applicable inventive innovations that can be embodied in a wide variety of specific contexts. The specific embodiments discussed are merely illustrative, and do not limit the scope of the disclosure.

Some embodiments have one or a combination of the following features and/or advantages. A semiconductor wafer includes a plurality of dies and at least one test probe. Each of the plurality of dies includes a radio frequency identification (RFID) tag circuit. The at least one test probe includes a plurality of probe pads. The plurality of probe pads is configured to transmit power signals and data to each of the plurality of dies, and to receive test results from each of the plurality of dies. The data are transmitted to each of the plurality of dies in a serial manner. The test results of each of the plurality of dies are also transmitted to the plurality of probe pads in a serial manner.

Figure 1:
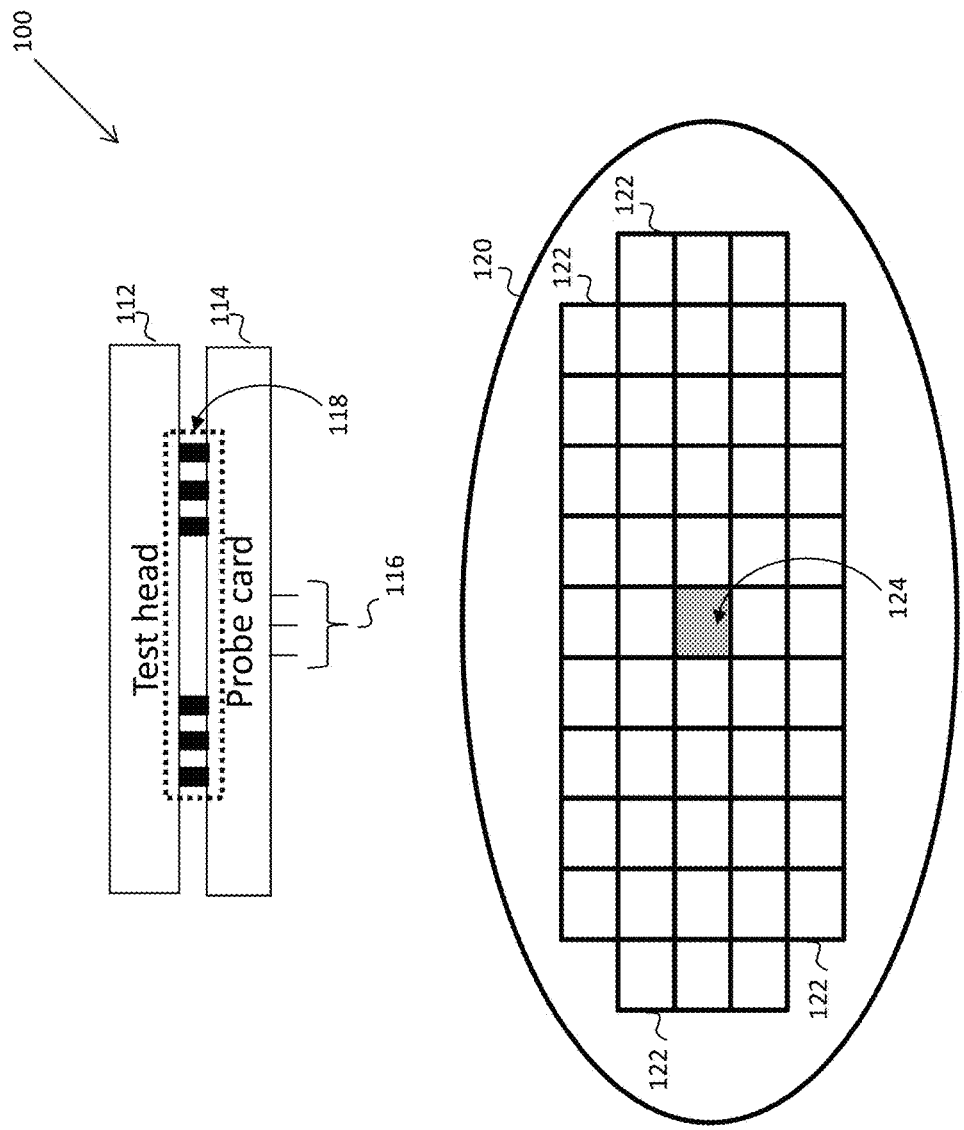
FIG. 1 is a system 100 of a wafer testing of RFID tags in accordance with some embodiments.

FIG. 1 is a system 100 of a wafer testing of RFID tags according to some example embodiments. The system 100 includes a test head 112 of a tester (not shown), a probe card 114, and a RFID wafer 120. A probe interface 118 is configured to connect the test head 112 and the probe card 114. A plurality of probe pins 116 are on the probe card 114. In some embodiments, the plurality of probe pins 116 are cantilever probes, Cobra needle probes, membrane bumps, and/or other compliant contact technologies. In a wafer test, test patterns that are specified by users in the tester are configured to convert into separated power signals, control signals, data signals and clock signals. The power signals, control signals, data signals and clock signals are transmitted from the tester to the plurality of probe pins 116 through the test head 112, probe interface 118 and the probe card 114. The RFID wafer 120 includes a plurality of RFID dies 122 and a test probe 124. For illustration purposes, only four RFID dies 122 are labeled. Each of the plurality of RFID dies includes an RFID tag circuit. The test probe 124 includes a plurality of probe pads (not shown). In a wafer test, the plurality of probe pins 116 physically touches the corresponding probe pads in the test probe 124 such that the control signals, data signals, clock signals and power signals on the plurality of probe pins 116 are transmitted to the plurality of probe pads in the test probe 124. The plurality of probe pads in the test probe 124 is electrically connected to corresponding RFID dies 122 such that the control signals, data signals, clock signal and power signals on the plurality of probe pads are transmitted to the specified RFID dies 122.

Although the RFID wafer 120 only has one test probe 124, other numbers of test probes 124 are within the scope of various embodiments. Although the test probe 124 is located at the center of the RFID wafer 120 in FIG. 1, other locations on the RFID wafer 120 are within the scope of various embodiments.

Figure 2:
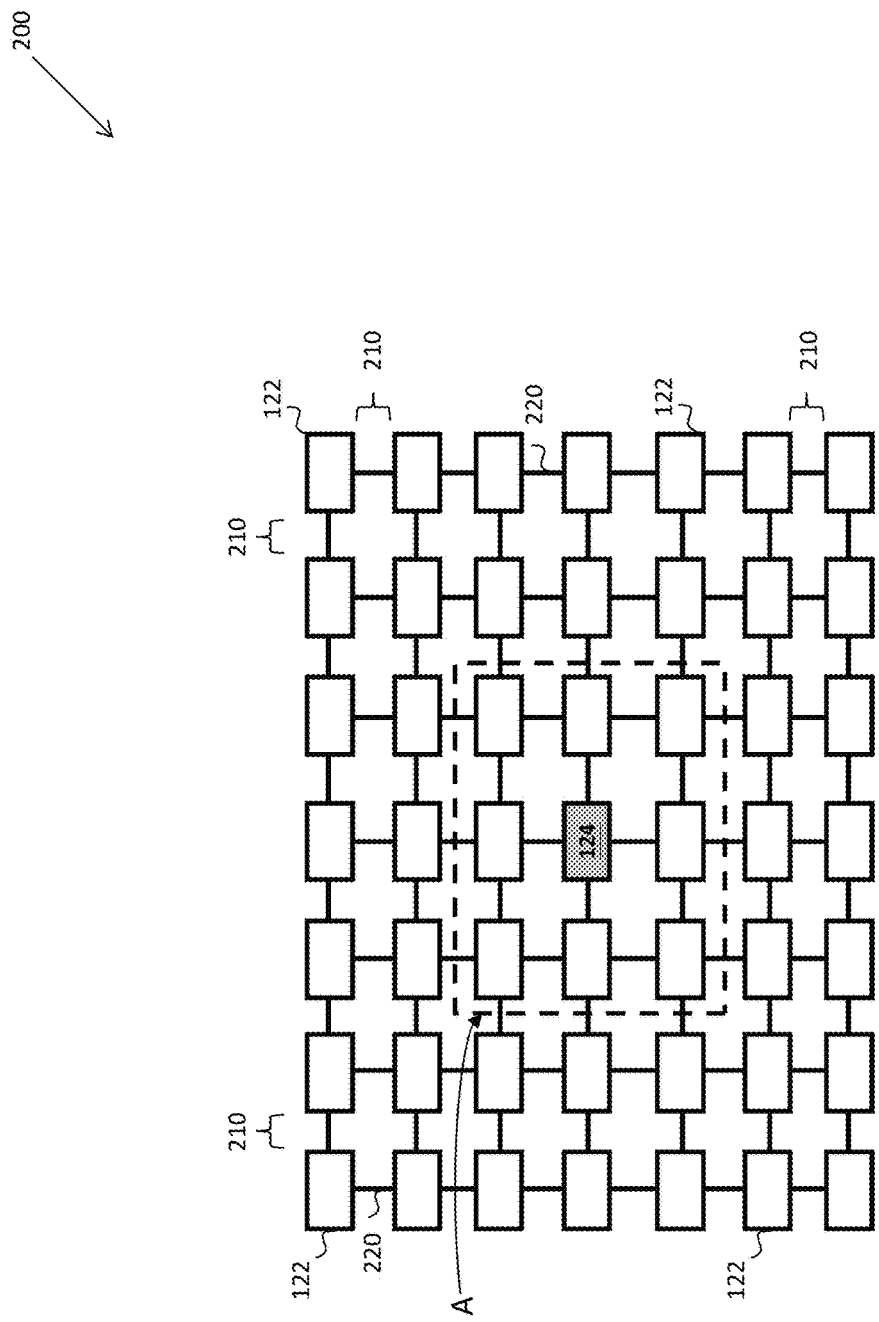
FIG. 2 illustrates a power signal transmission from the test probe 124 to each of the plurality of RFID dies 122 in a die fragment 200 of the RFID wafer 120 in FIG. 1 in accordance with some embodiments.

FIG. 2 illustrates a power signal transmission from the test probe 124 to each of the plurality of RFID dies 122 in a die fragment 200 of the RFID wafer 120 in FIG. 1 according to some example embodiments. The die fragment 200 includes a plurality of RFID dies 122, the test probe 124 and scribe regions 210. For illustration purposes, only four RFID dies 122, two conductive lines 220 and four scribe regions 210 are labeled. The plurality of RFID dies 122 and the test probe 124 are similar to the corresponding ones in FIG. 1. The scribe regions 210 are spaces in between the plurality of RFID dies 122 such that the RFID wafer 120 in FIG. 1 is cut into physically separated RFID dies 122 along the scribe region 210 without damaging the RFID dies 122. In some embodiments, a saw is configured to cut the RFID wafer 120 in FIG. 1 into physically separated RFID dies 122. In some embodiments, the saw is a water-cooled circular saw with diamond-tipped teeth. In some embodiments, the RFID wafer 120 in FIG. 1 is cut into physically separated RFID dies 122 using chemical etching process. In some embodiments, the RFID wafer 120 in FIG. 1 is cut into physically separated RFID dies 122 using laser scribing.

The power signals on the probe pads in the test probe 124 are transmitted to each of the plurality of RFID dies 122 through conductive lines 220 in the scribe regions 210 and power planes (not shown) in the RFID dies 122 and the test probe 124. At least one conductive line 220 is electrically connected between two adjacent RFID dies 122 or between test probe 124 and RFID dies 122 to transmit power signals. The conductive lines 220 are generated by conductive materials such as metal lines, Oxide Definition (OD), polysilicon (POLY), Redistribution Layer (RDL), and the like. A region A will be explained in details with reference to FIG. 3.

Figure 3:
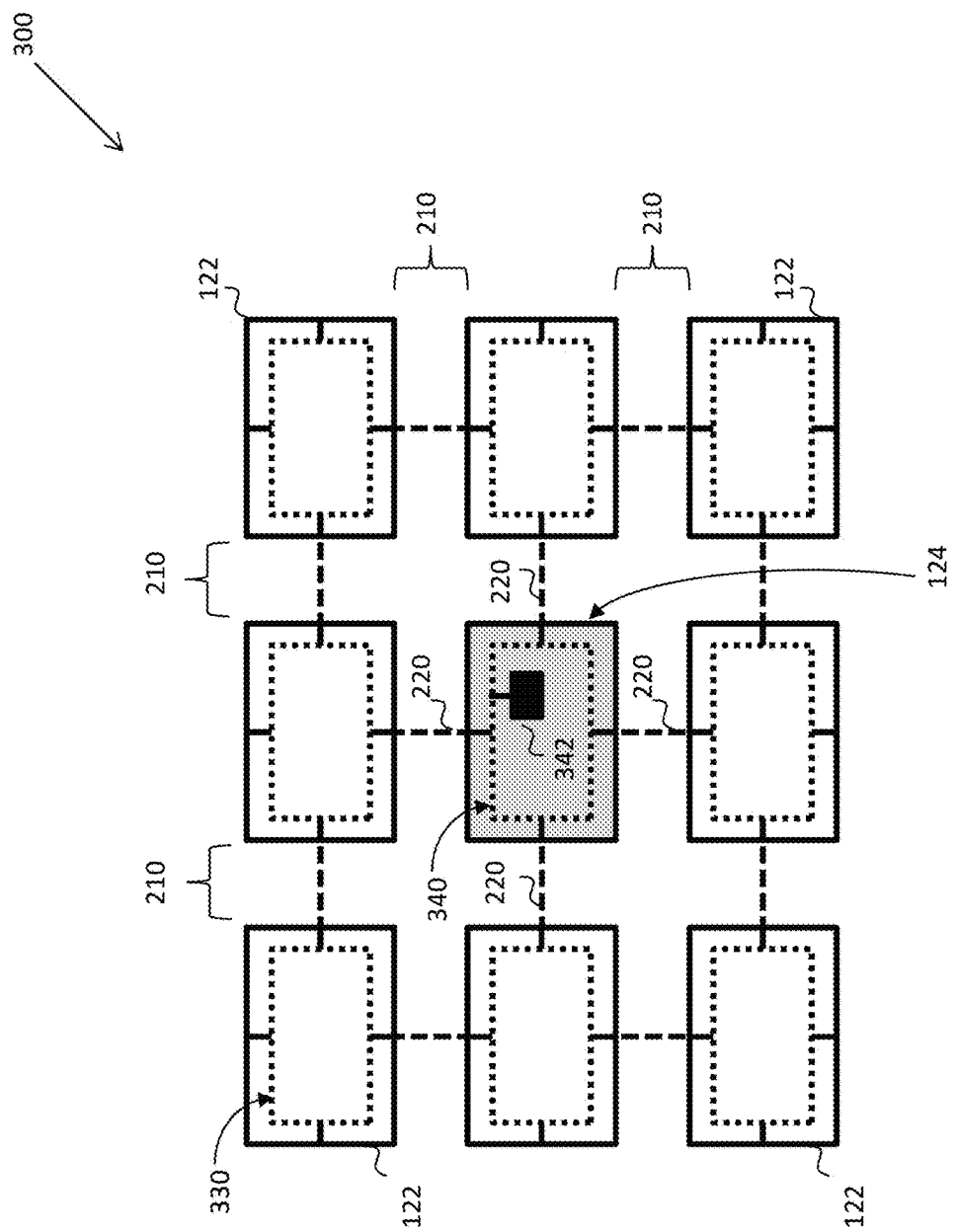
FIG. 3 is an enlarged plane view 300 of a region A in FIG. 2 to illustrate power transmission from the test probe 124 to each RFID die 122 in details in accordance with some embodiments.

FIG. 3 is an enlarged plane view 300 of region A in FIG. 2 to illustrate power transmissions from the test probe 124 to each RFID die 122 in details, according to some example embodiments. FIG. 3 includes a plurality of RFID dies 122, the test probe 124 and the scribe regions 210. For illustration purposes, only four RFID dies 122 and four conductive lines 220 are labeled. The scribe regions 210 are similar to the ones described in FIG. 2. The test probe 124 includes power signal probe pads 342 and power planes 340. The power planes 340 are in a ring structure to have conductive lines surrounding the test probe 124. The power signal probe pads 342 are electrically connected to the power planes 340. The adjacent conductive lines 220 around the test probe 124 are electrically connected to the power planes 340. Each of the plurality of RFID dies 122 includes power planes 330. The power planes 330 are in a ring structure to have conductive lines surrounding each of the plurality of RFID dies 122. The power planes 330 of each of the plurality of RFID dies 122 are electrically connected to the adjacent conductive lines 220 around that RFID die. In this way, the power signals on the power signal probe pads 342 are transmitted to each of the plurality of RFID dies 122 through the power planes 340 in the test probe 124, the conductive lines 220 in the scribe regions 210 and the power planes 330 of the plurality of RFID dies 122.

In some embodiments, the power signal probe pads 342 in the test probe 124 include at least one VDD pad and at least one ground pad, and the VDD pads and the ground pads are electrically connected to corresponding individual power planes 340 in the test probe 124. VDD refers operation power for RFID tag circuit in each of the plurality of RFID dies 122. For simplicity, only one power signal probe pad 342 and one power plane 340 in test probe 124 are shown and labeled in FIG. 3. In some embodiments, each of the plurality of RFID dies 122 includes at least one power plane for VDD and at least one power plane for ground. For simplicity, only one power plane 330 is shown in each of the plurality of RFID dies 122, and only one power plane 330 is labeled in FIG. 3. The power planes 340 for VDD in the test probe 124 are electrically connected to the power planes 330 for VDD in adjacent RFID dies 122 through corresponding conductive lines 220 for VDD. The power planes 340 for ground in the test probe 124 are electrically connected to the power planes 330 for ground in adjacent RFID dies 122 through corresponding conductive lines 220 for ground.

Although the power planes 330 and 340 in FIG. 3 are in a ring structure, other structures of the power planes 330 and 340 are within the scope of various embodiments. For example, the power planes 330 and 340 in FIG. 3 are in a mesh structure. In some embodiments, the test probe 124 and the plurality of RFID dies 122 include different structures of power planes. For example, the power planes 340 of the test probe 124 are in a mesh structure and the power planes 330 of the plurality of RFID dies 122 are in ring structure, and vice versa. In some embodiments, the power planes 330 and 340 are generated by conductive materials such as metal lines, Oxide Definition (OD), polysilicon (POLY), Redistribution Layer (RDL), and the like.

Figure 4:
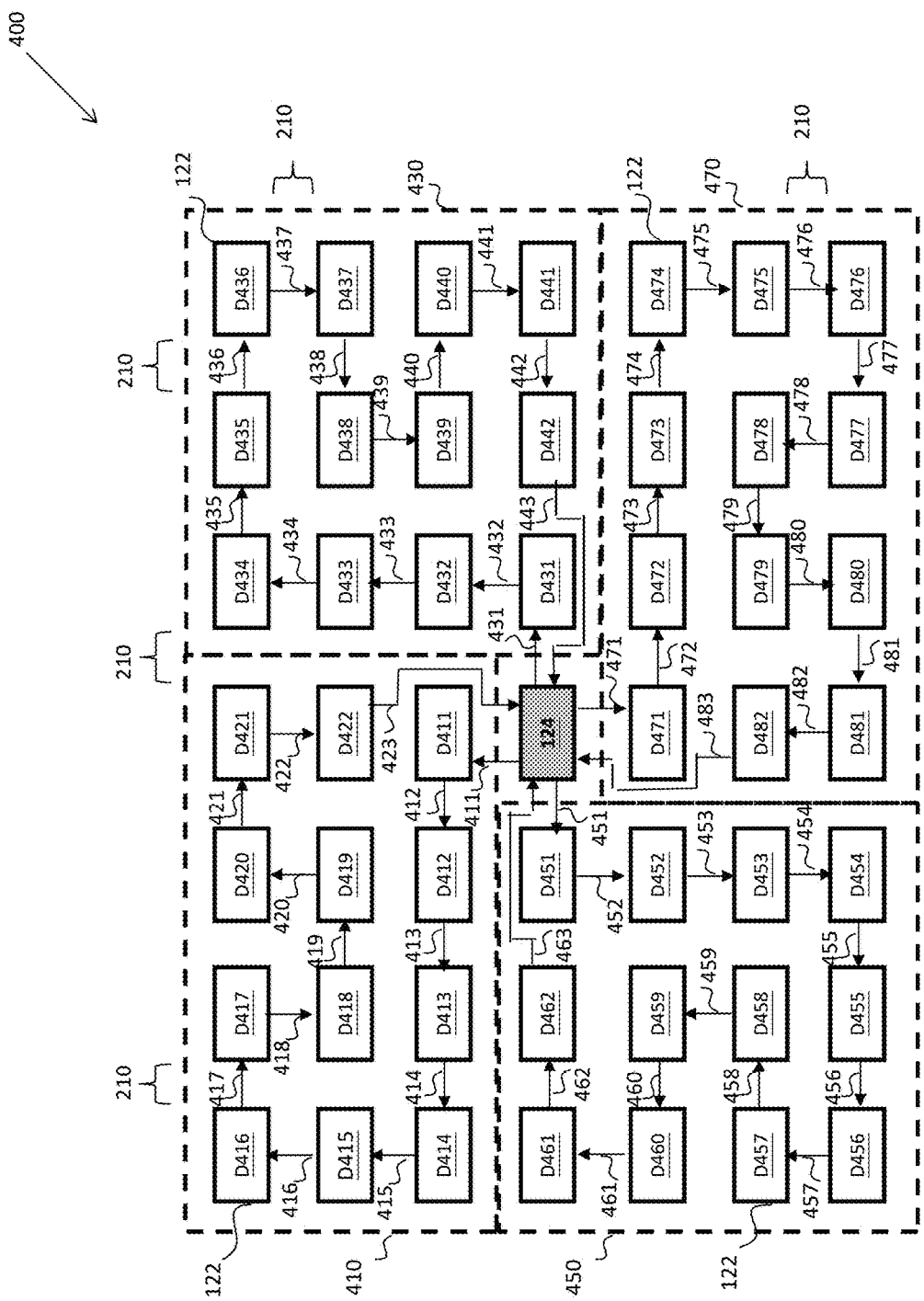
FIG. 4 is a die fragment 400 of the RFID wafer 120 in FIG. 1 to illustrate the transmission of control and data signals from the test probe 124 to each of the plurality of RFID dies 122 in accordance with some embodiments.

FIG. 4 is a die fragment 400 of the RFID wafer 120 in FIG. 1 to illustrate the transmission of control and data signals from the test probe 124 to each of the plurality of RFID dies 122 in a according to some example embodiments. The die fragment 400 includes a plurality of RFID dies 122, the test probe 124 and the scribe regions 210. For illustration purposes, only four RFID dies 122 and five scribe regions 210 are labeled. The plurality of RFID dies 122 in the die fragment 400 are divided into four shifting chains 410, 430, 450 and 470. The RFID dies in the same shifting chain are electrically and serially connected by conductive lines in the scribe regions 210. In other words, the RFID dies in the same shifting chain are electrically and non-parallelly connected by the conductive lines in the scribe regions 210. For example, in shifting chain 410, RFID dies D411-D422 are electrically and serially connected by conductive lines 412-422, respectively. The conductive lines in the scribe regions 210 are generated by conductive materials such as metal lines, Oxide Definition (OD), polysilicon (POLY), Redistribution Layer (RDL), and the like. The control and data signals that are configured to test functionalities of RFID dies in a wafer test are transmitted from probe pads (not shown) in the test probe 124 to each of RFID dies in the same shifting chain in a serial manner.

For example, in the shifting chain 410, the control and data signals that are configured to test functionalities of RFID die D413 in a wafer test are serially transmitted from the probe pads in the test probe 124 through conductive lines 411, RFID die D411, conductive lines 412, RFID die D412, and conductive lines 413 to RFID die D413. For another example, the testing results of RFID die D420 are serially transmitted through conductive lines 421, RFID die D421, conductive lines 422, RFID die D422, and conductive lines 423 to the probe pads in the test probe 124.

For example, in the shifting chain 430, the control and data signals that are configured to test functionalities of RFID die D433 in a wafer test are serially transmitted from the probe pads in the test probe 124 through conductive lines 431, RFID die D431, conductive lines 432, RFID die D432, and conductive lines 433 to RFID die D433. For another example, the testing results of RFID die D440 are serially transmitted through conductive lines 441, RFID die D441, conductive lines 442, RFID die D442, and conductive lines 443 to the probe pads in the test probe 124.

For example, in the shifting chain 450, the control and data signals that are configured to test functionalities of RFID die D453 in a wafer test are serially transmitted from the probe pads in the test probe 124 through conductive lines 451, RFID die D451, conductive lines 452, RFID die D452, and conductive lines 453 to RFID die D453. For another example, the testing results of RFID die D460 are serially transmitted through conductive lines 461, RFID die D461, conductive lines 462, RFID die D462, and conductive lines 463 to the probe pads in the test probe 124.

For example, in the shifting chain 470, the control and data signals that are configured to test functionalities of RFID die D473 in a wafer test are serially transmitted from the probe pads in the test probe 124 through conductive lines 471, RFID die D471, conductive lines 472, RFID die D472, and conductive lines 473 to RFID die D473. For another example, the testing results of RFID die D480 are serially transmitted through conductive lines 481, RFID die D481, conductive lines 482, RFID die D482, and conductive lines 483 to the probe pads in the test probe 124.

Although the plurality of RFID dies 122 in the die fragment 400 are divided into four shifting chains 410, 430, 450 and 470, another number of the shifting chains is within the scope of various embodiments.

Figure 5:
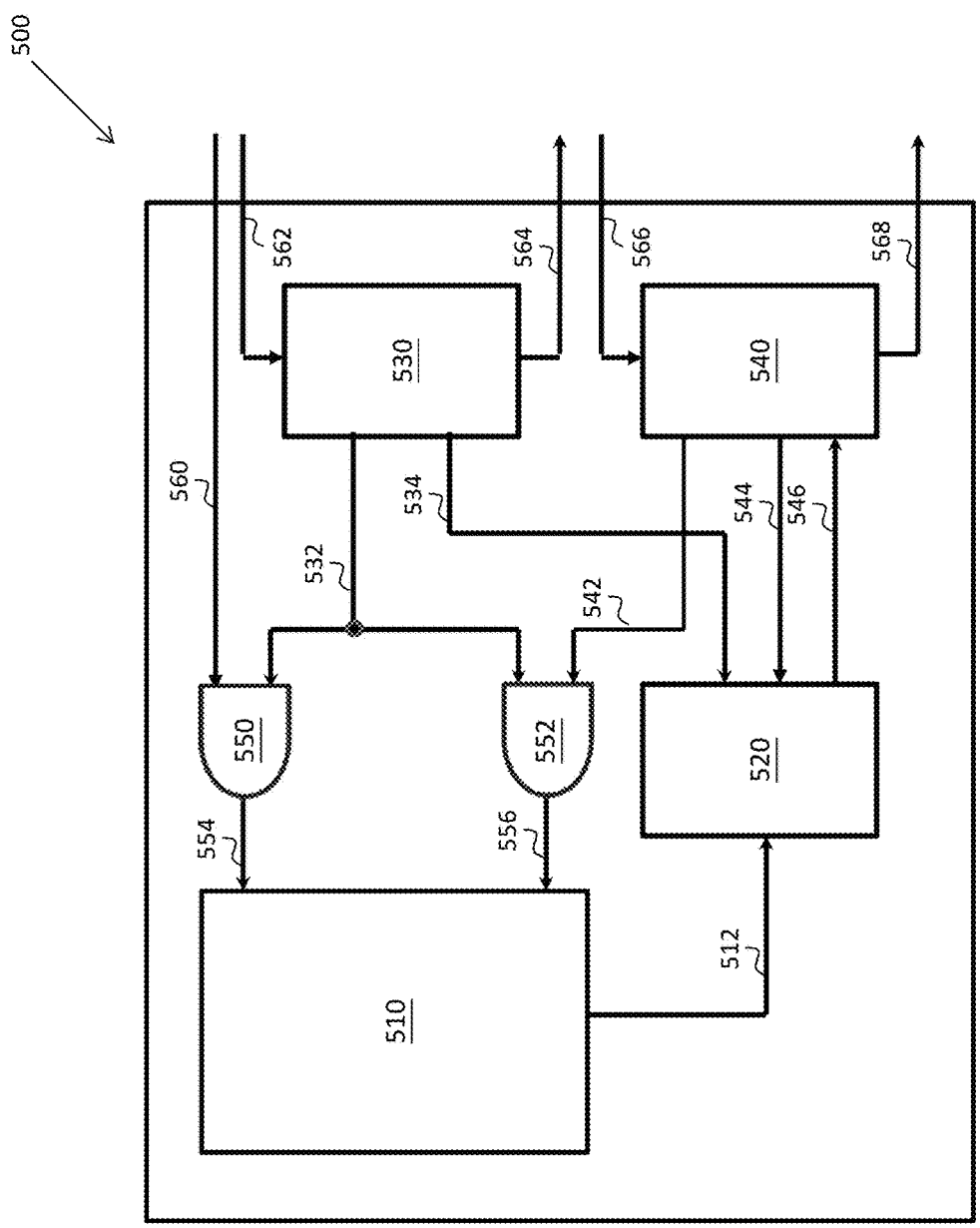
FIG. 5 is a schematic of a RFID die 500 to illustrate details of the RFID dies 122 in FIGS. 1, 2, 3 and 4 in accordance with some embodiments.

FIG. 5 is a schematic of an RFID die 500 to illustrate details of the RFID dies 122 in FIGS. 1, 2, 3 and 4 according to some example embodiments. The RFID die 500 includes a RFID tag circuit 510, a comparator 520, control signal shift registers 530, data signal shift registers 540 and AND gates 550 and 552. The power planes 330 in FIG. 3 are omitted in FIG. 5 for ease of illustration. The control signals that are configured to control testing of the RFID tag circuit 510 in the wafer test are shifted into the control signal shift registers 530 through conductive lines 562. Contents in the control signal shift registers 530 are shifted out through conductive lines 564. The control signals in the control signal shift registers 530 includes a command gated signal and a comparison start signal. The data signals that are configured to test the RFID tag circuit 510 in the wafer test are shifted into the data signal shift registers 540 through conductive lines 566. Contents of the data signal shift registers 540 are shifted out through conductive lines 568. The data in the data signal shift registers 540 includes test patterns, expected results of current test patterns and comparison results.

The conductive lines 562 of the current RFID die are electrically connected to the conductive lines 564 of previous RFID die in sequence in the same shifting chain or to the test probe 124 in FIG. 4. The conductive lines 564 of current RFID die are electrically connected to the conductive lines 562 of following RFID die in sequence in the same shifting chain or to the test probe 124 in FIG. 4. For example, in the shifting chain 410 in FIG. 4, the conductive lines 562 in FIG. 5 of the RFID die D412 in FIG. 4 are electrically connected to the conductive lines 564 in FIG. 5 of the RFID die D411 in FIG. 4 through conductive lines 412 in FIG. 4. The conductive lines 564 in FIG. 5 of the RFID die D412 in FIG. 4 are electrically connected to the conductive lines 562 of the RFID die D413 in FIG. 4 through the conductive lines 413 in FIG. 4. The conductive lines 562 in FIG. 5 of the RFID die D411 in FIG. 4 are electrically connected to the probe pads in the test probe 124 such that the control signals on the probe pads are configured to shift into the control signal shift registers 530 in FIG. 5 of the RFID die D411 in FIG. 4. The conductive lines 564 in FIG. 5 of the RFID die D422 in FIG. 4 are electrically connected to the probe pads in the test probe 124 such that the contents of the control signal shift registers 530 are configured to shift out to the probe pads in the test probe 124 in FIG. 4.

The conductive lines 566 of the current RFID die are electrically connected to the conductive lines 568 of previous RFID die in sequence in the same shifting chain or to the test probe 124 in FIG. 4. The conductive lines 568 of current RFID die are electrically connected to the conductive lines 566 of following RFID die in sequence in the same shifting chain or to the test probe 124 in FIG. 4. For example, in the shifting chain 410 in FIG. 4, the conductive lines 566 in FIG. 5 of the RFID die D412 in FIG. 4 are electrically connected to the conductive lines 568 in FIG. 5 of the RFID die D411 in FIG. 4 through conductive lines 412 in FIG. 4. The conductive lines 568 in FIG. 5 of the RFID die D412 in FIG. 4 are electrically connected to the conductive lines 566 of the RFID die D413 in FIG. 4 through the conductive lines 413 in FIG. 4. The conductive lines 566 in FIG. 5 of the RFID die D411 in FIG. 4 are electrically connected to the probe pads in the test probe 124 such that the data signals on the probe pads are configured to shift into the data signal shift registers 540 in FIG. 5 of the RFID die D411 in FIG. 4. The conductive lines 568 in FIG. 5 of the RFID die D422 in FIG. 4 are electrically connected to the probe pads in the test probe 124 such that the contents of the data signal shift registers 540 are configured to shift out to the probe pads in the test probe 124 in FIG. 4.

A clock signal on a conductive line 560 is electrically connected to an input port of the AND gate 550. The test patterns in the data signal shift registers 540 are transmitted through conductive lines 542 to inputs of the AND gates 552. The command gated signal in the control signal shift registers 530 is electrically connected to inputs of each of the AND gates 550 and 552 through a conductive line 532. The command gated signal is configured to decide when the clock signal on the conductive line 560 and the test patterns on the conductive lines 542 are transmitted to the RFID tag circuit 510. When the command gated signal is "0", the clock signal on the conductive line 560 and the test patterns on the conductive lines 542 are blocked at the AND gates 550 and 552 as the outputs of the AND gates 550 and 552 are set to a constant value "0". When the command gated signal is "1", the clock signal on the conductive line 560 is transmitted through conductive line 554 to the RFID tag circuit 510, the test patterns on the conductive lines 542 are transmitted through conductive lines 556 to the RFID tag circuit 510. Although the AND gates 550 and 552 are used in FIG. 5, other logical gates, such as OR, NAND, NOR, XOR, XNOR gates, are within the scope of various embodiments.

The expected results of current test patterns in the data signal shift registers 540 are transmitted through conductive lines 544 to the comparator 520. After receiving test patterns from the conductive lines 556, the RFID tag circuit 510 outputs the execution results through conductive lines 512 to the comparator 520. The comparison start signal in the control signal shift registers 530 is electrically connected to the comparator 520 through a conductive line 534. The comparison start signal is configured to decide when the comparison in the comparator 520 between the execution results of the RFID tag circuit 510 and the expected results of current test patterns in the data signal shift registers 540 is started. When the comparison start signal on the conductive line 534 is "1", the comparison in the comparator 520 between the execution results of the RFID tag circuit 510 and the expected results of current test patterns on the conductive lines 544 is started, and the comparison results are outputted from the comparator 520 and written into the data signal shift registers 540 through conductive lines 546.

Figure 6:
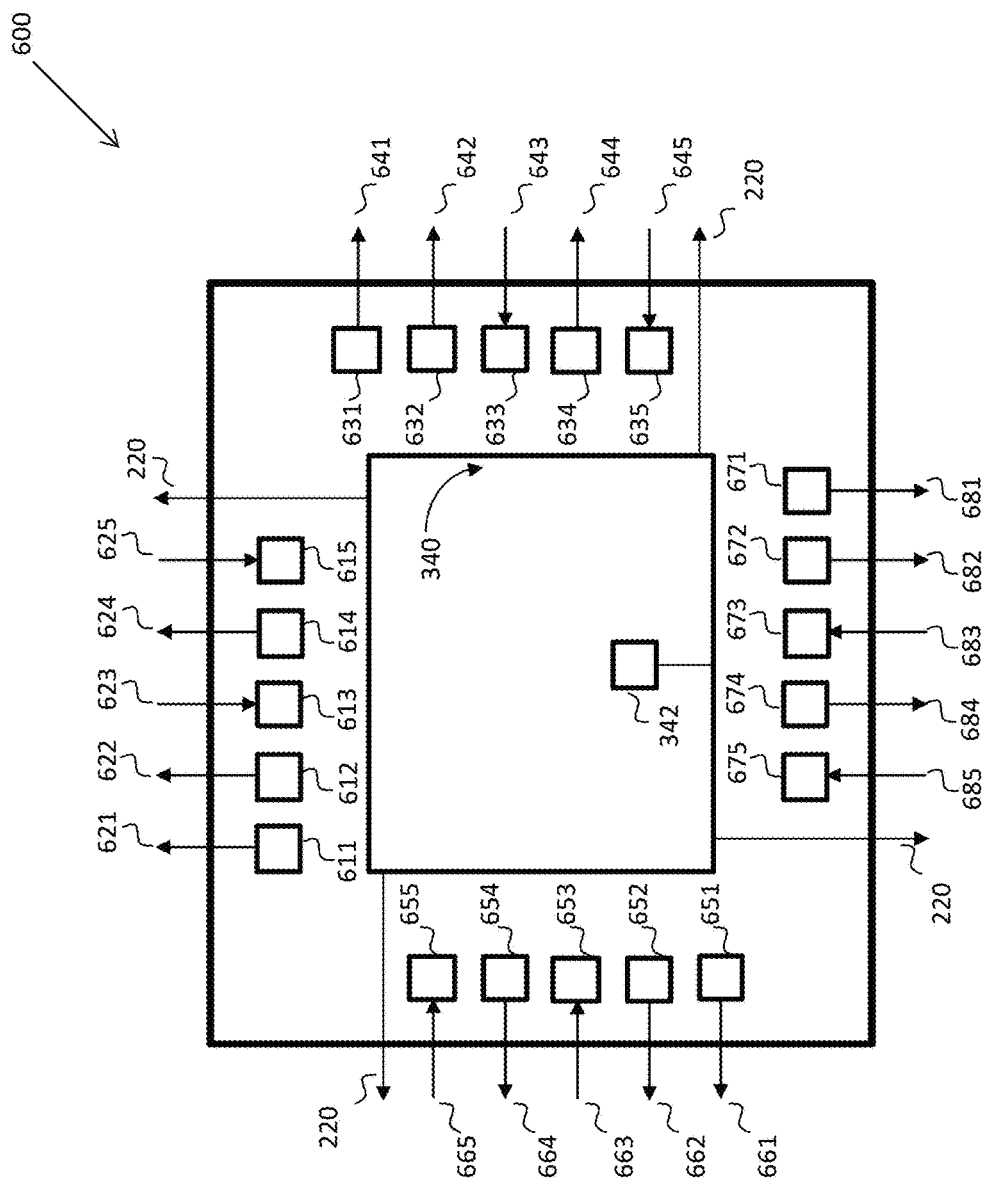
FIG. 6 is a test probe 600 to illustrate details of the test probe 124 in FIGS. 1, 2, 3 and 4 in accordance with some embodiments.

FIG. 6 is a test probe 600 to illustrate details of the test probe 124 in FIGS. 1, 2, 3 and 4 according to some example embodiments. The test probe 600 includes probe pads 611-615, 631-635, 651-655, 671-675, the power planes 340 and the power signal probe pads 342. The power planes 340 and the power signal probe pads 342 are similar to the corresponding ones described in FIG. 3. The power signals on the power signal probe pads 342 are transmitted through the power planes 340 and the conductive lines 220 to each of the plurality of RFID dies 122 in FIG. 3. In some embodiments, the power signal probe pads 342 in the test probe 600 include at least one VDD pad and at lease one ground pad. Each of the VDD and the ground pads in the test probe 600 is electrically connected to corresponding power planes 340, and the power planes 340 are electrically connected to adjacent RFID dies through corresponding conductive lines 220.

The probe pads 611, 631, 651, 671 are electrically connected to each of the RFID dies in the shifting chains 410, 430, 450 and 470 in FIG. 4, respectively, through the conductive lines 621, 641, 661 and 681, respectively, and are configured to transmit the clock signal as described in FIG. 4 and FIG. 5. For example, the clock signal on the probe pads 611 is transmitted through the conductive lines 621 to each of the RFID dies in the shifting chains 410 in FIG. 4.

The probe pad 612 is electrically connected to the conductive lines 562 in FIG. 5 of the RFID die D411 in the shifting chain 410 in FIG. 4 such that the control signals on the probe pad 612 are configured to serially shift into the control signal shift registers 530 in FIG. 5 of the RFID dies in the shifting chain 410 in FIG. 4. The probe pad 613 is electrically connected to the conductive lines 564 in FIG. 5 of the RFID die D422 in the shifting chain 410 in FIG. 4 to receive the shift out data of the control signal shift registers 530 in FIG. 5 of the RFID die D422 in the shifting chain 410 in FIG. 4.

The probe pad 614 is electrically connected to the conductive lines 566 in FIG. 5 of the RFID die D411 in the shifting chain 410 in FIG. 4 such that the data signals on the probe pad 614 are configured to serially shift into the data signal shift registers 540 in FIG. 5 of the RFID dies in the shifting chain 410 in FIG. 4. The probe pad 615 is electrically connected to the conductive lines 568 in FIG. 5 of the RFID die D422 in the shifting chain 410 in FIG. 4 to receive the shift out data of the data signal shift registers 540 in FIG. 5 of the RFID die D422 in the shifting chain 410 in FIG. 4.

The probe pad 632 is electrically connected to the conductive lines 562 in FIG. 5 of the RFID die D431 in the shifting chain 430 in FIG. 4 such that the control signals on the probe pad 632 are serially configured to shift into the control signal shift registers 530 in FIG. 5 of the RFID dies in the shifting chain 430 in FIG. 4. The probe pad 633 is electrically connected to the conductive lines 564 in FIG. 5 of the RFID die D442 in the shifting chain 430 in FIG. 4 to receive the shift out data of the control signal shift registers 530 in FIG. 5 of the RFID die D442 in the shifting chain 430 in FIG. 4.

The probe pad 634 is electrically connected to the conductive lines 566 in FIG. 5 of the RFID die D431 in the shifting chain 430 in FIG. 4 such that the data signals on the probe pad 634 are configured to serially shift into the data signal shift registers 540 in FIG. 5 of the RFID dies in the shifting chain 430 in FIG. 4. The probe pad 635 is electrically connected to the conductive lines 568 in FIG. 5 of the RFID die D442 in the shifting chain 430 in FIG. 4 to receive the shift out data of the data signal shift registers 540 in FIG. 5 of the RFID die D442 in the shifting chain 430 in FIG. 4.

The probe pad 652 is electrically connected to the conductive lines 562 in FIG. 5 of the RFID die D451 in the shifting chain 450 in FIG. 4 such that the control signals on the probe pad 652 are configured to serially shift into the control signal shift registers 530 in FIG. 5 of the RFID dies in the shifting chain 450 in FIG. 4. The probe pad 653 is electrically connected to the conductive lines 564 in FIG. 5 of the RFID die D462 in the shifting chain 450 in FIG. 4 to receive the shift out data of the control signal shift registers 530 in FIG. 5 of the RFID die D462 in the shifting chain 450 in FIG. 4.

The probe pad 654 is electrically connected to the conductive lines 566 in FIG. 5 of the RFID die D451 in the shifting chain 450 in FIG. 4 such that the data signals on the probe pad 654 are configured to serially shift into the data signal shift registers 540 in FIG. 5 of the RFID dies in the shifting chain 450 in FIG. 4. The probe pad 655 is electrically connected to the conductive lines 568 in FIG. 5 of the RFID die D462 in the shifting chain 450 in FIG. 4 to receive the shift out data of the data signal shift registers 540 in FIG. 5 of the RFID die D462 in the shifting chain 450 in FIG. 4.

The probe pad 672 is electrically connected to the conductive lines 562 in FIG. 5 of the RFID die D471 in the shifting chain 470 in FIG. 4 such that the control signals on the probe pad 672 are configured to serially shift into the control signal shift registers 530 in FIG. 5 of the RFID dies in the shifting chain 470 in FIG. 4. The probe pad 673 is electrically connected to the conductive lines 564 in FIG. 5 of the RFID die D482 in the shifting chain 470 in FIG. 4 to receive the shift out data of the control signal shift registers 530 in FIG. 5 of the RFID die D482 in the shifting chain 470 in FIG. 4.

The probe pad 674 is electrically connected to the conductive lines 566 in FIG. 5 of the RFID die D471 in the shifting chain 470 in FIG. 4 such that the data signals on the probe pad 674 are configured to serially shift into the data signal shift registers 540 in FIG. 5 of the RFID dies in the shifting chain 470 in FIG. 4. The probe pad 675 is electrically connected to the conductive lines 568 in FIG. 5 of the RFID die D482 in the shifting chain 470 in FIG. 4 to receive the shift out data of the data signal shift registers 540 in FIG. 5 of the RFID die D482 in the shifting chain 470 in FIG. 4.

Figure 7:
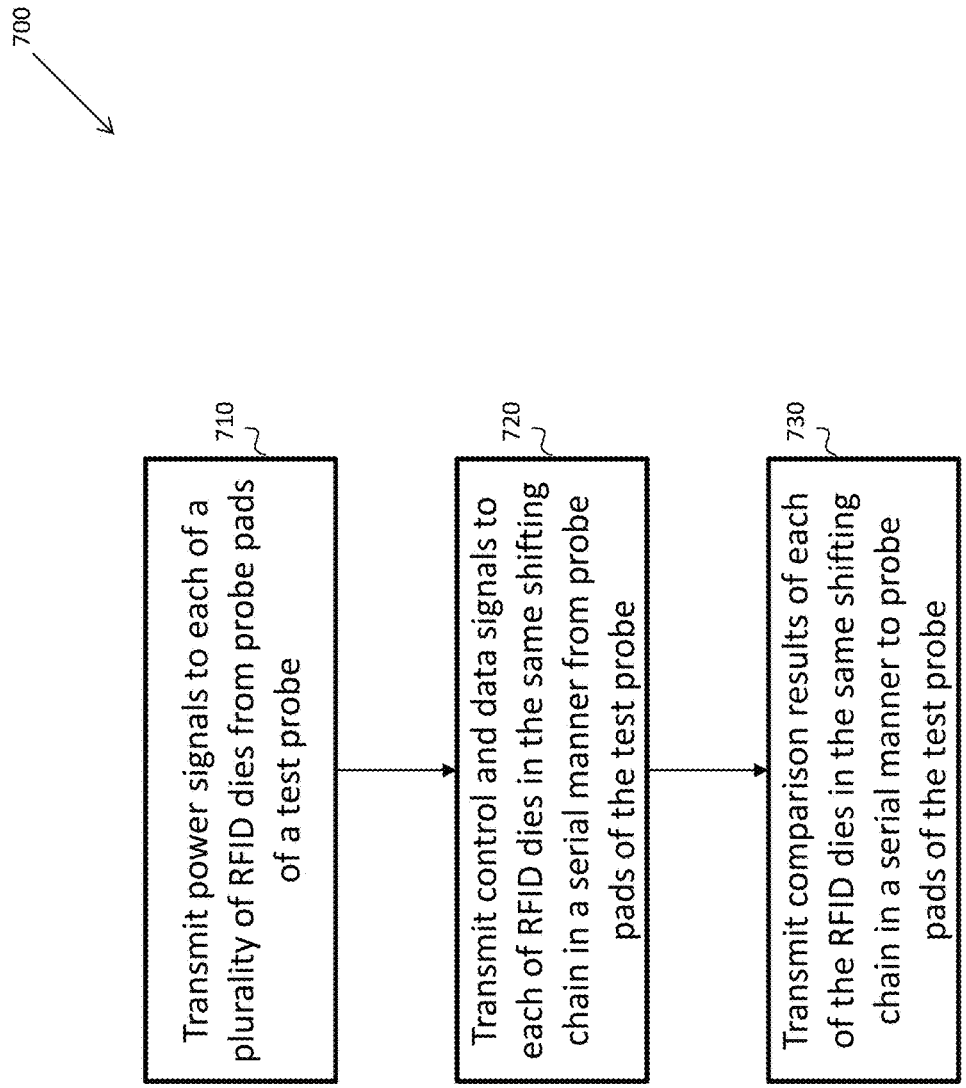
FIG. 7 is a flow chart 700 of a wafer testing method of RFID tags in FIG. 1 in accordance with some embodiments.

FIG. 7 illustrates a flow chart 700 of a wafer testing method of RFID tags in FIG. 1 according to some example embodiments.

In step 710, the power signals on the probe pads 342 in FIG. 6 are transmitted to each of the plurality of RFID dies 122 in the RFID wafer 120 in FIG. 1. For example, in FIG. 3, the power signals on the probe pads 342 are transmitted through the power planes 340 in the test probe 124, the conductive lines 220 in the scribe regions 210 and the power planes 330 in the RFID dies 122 to each of the plurality of RFID dies 122.

In step 720, the control and data signals on the probe pads 612, 614, 632, 634, 652, 654, 672, 674, respectively, in FIG. 6 are transmitted to each of RFID dies 122 in FIG. 4 in the same shifting chain in a serial manner. For example, in the shifting chain 410 in FIG. 4, the control signals on the probe pads 612 in FIG. 6 are transmitted through conductive lines 411 in FIG. 4, the control signal shift registers 530 in FIG. 5 of RFID die D411 in FIG. 4, conductive lines 412 in FIG. 4, the control signal shift registers 530 in FIG. 5 of RFID die D412 in FIG. 4 and conductive lines 413 in FIG. 4 to the control signal shift registers 530 in FIG. 5 of RFID die D413 in FIG. 4 in a serial manner.

For example, in the shifting chain 410 in FIG. 4, the data signals on the probe pads 614 in FIG. 6 are transmitted through conductive lines 411 in FIG. 4, the data signal shift registers 540 in FIG. 5 of RFID die D411 in FIG. 4, conductive lines 412 in FIG. 4, the data signal shift registers 540 in FIG. 5 of RFID die D412 in FIG. 4 and conductive lines 413 in FIG. 4 to the data signal shift registers 540 in FIG. 5 of RFID die D413 in FIG. 4 in a serial manner.

In step 730, the comparison results in the data signal shift registers 540 of each of the RFID dies in the same shifting chain are transmitted to probe pads 615, 635, 655, 675 respectively of the test probe 124 in FIG. 6 in a serial manner. For example, in the shifting chain 410 in FIG. 4, the comparison results in the data signal shift registers 540 in FIG. 5 of RFID die D420 in FIG. 4 are transmitted through conductive lines 421 in FIG. 4, the data signal shift registers 540 in FIG. 5 of RFID die D421 in FIG. 4, conductive lines 422 in FIG. 4, the data signal shift registers 540 in FIG. 5 of RFID die D422 in FIG. 4, conductive lines 423 in FIG. 4 to the probe pads 615 in FIG. 6.

In some embodiments, a semiconductor wafer includes a plurality of dies and at least one test probe. Each of the plurality of dies includes a radio frequency identification (RFID) tag circuit. The at least one test probe includes a plurality of probe pads. The plurality of probe pads is configured to transmit power signals and data to each of the plurality of dies, and to receive test results from each of the plurality of dies. The data are transmitted to each of the plurality of dies in a serial manner. The test results of each of the plurality of dies are transmitted to the plurality of probe pads in a serial manner.

In some embodiments, a system for testing radio frequency identification (RFID) tags includes a probe card and a wafer. The probe card includes a plurality of probe pins. The wafer includes a plurality of dies and at least one test probe. Each of the plurality of dies includes a RFID tag circuit. The at least one test probe includes a plurality of probe pads. The plurality of probe pads is configured to transmit power signals and data to each of the plurality of dies, and to receive test results from each of the plurality of dies. The plurality of dies and the at least one test probe include power planes to transmit power signals to adjacent dies.

In some embodiments, a method of configuring a wafer testing of radio frequency identification (RFID) tags includes transmitting power signals to each of a plurality of dies from probe pads of a test probe. The method also includes transmitting control and data signals to each of dies in the same shifting chain in a serial manner from probe pads of the test probe. The method further includes transmitting testing results of each of the dies in the same shifting chain in a serial manner to probe pads of the test probe.

In some embodiments, a semiconductor wafer includes a plurality of dies, each of the plurality of dies comprising a radio frequency identification (RFID) tag circuit. The semiconductor wafer further includes at least one test probe comprising a plurality of probe pads, the plurality of probe pads being configured to transmit power signals, data signals and control signals to each of the plurality of dies, and to receive test results from each of the plurality of dies, the data signals, the control signals and the test results being transmitted serially from one of the plurality of dies to another of the plurality of dies.

In some embodiments, a semiconductor wafer includes a plurality of dies, each of the plurality of dies comprising a radio frequency identification (RFID) tag circuit, the plurality of dies being serially connected to each other to form a die chain, and a plurality of scribe regions, each of the plurality of scribe regions being interposed between corresponding adjacent dies. The semiconductor wafer further includes a plurality of conductive lines disposed in the scribe regions, adjacent dies in the die chain being electrically coupled using at least one of the plurality of conductive lines, and a test probe electrically coupled to the die chain using at least one of the plurality of conductive lines, the test probe comprising a plurality of probe pads, the plurality of probe pads being configured to transmit data signals and control signals through the die chain.

In some embodiments, a semiconductor wafer includes a plurality of dies, each of the plurality of dies comprising a radio frequency identification (RFID) tag circuit, the plurality of dies being coupled to form a plurality of die chains, each one of the die chains comprising serially connected dies, and a test probe electrically coupled to the plurality of the die chains. The test probe includes first probe pads, the first probe pads being configured to transmit data signals and control signals through the plurality of die chains, and second probe pads, the second probe pads being configured to transmit power signals through the plurality of die chains.

While the disclosure has been described by way of examples and in terms of disclosed embodiments, the invention is not limited to the examples and disclosed embodiments. To the contrary, various modifications and similar arrangements are covered as would be apparent to those of ordinary skill in the art. Therefore, the scope of the appended claims should be accorded the broadest interpretation so as to encompass such modifications and arrangements.

What is claimed is:

1. A semiconductor wafer comprising:
   a plurality of dies, each of the plurality of dies comprising a radio frequency identification (RFID) tag circuit; and
   at least one test probe comprising a plurality of probe pads, the plurality of probe pads being configured to transmit power signals, data signals and control signals to each of the plurality of dies, and to receive test results from each of the plurality of dies, the data signals, the control signals and the test results being transmitted serially from one individual die of the plurality of dies to another individual die of the plurality of dies through a conductive line.

2. The semiconductor wafer of claim 1, wherein the power signals, the data signals, the control signals, and the test results are transmitted through conductive lines in scribe regions of the semiconductor wafer between adjacent RFID tag circuits.

3. The semiconductor wafer of claim 1, wherein each of the plurality of dies and the test probe include power planes to transmit power signals between adjacent dies.

4. The semiconductor wafer of claim 3, wherein the power planes in each of the plurality of dies and the test probe include at least one VDD plane and at least one ground plane.

5. The semiconductor wafer of claim 1, wherein each of the plurality of dies includes control signal shift registers and data signal shift registers to store control and data signals, respectively, that are configured to test a corresponding RFID tag circuit.

6. The semiconductor wafer of claim 5, wherein an input of control signal shift registers and an input of data signal shift registers of a first die of the plurality of dies are electrically connected to an output of control signal shift registers and an output of data signal shift registers, respectively, of a previous die in a same die chain, and wherein an output of the control signal shift registers and an output of the data signal shift registers of the first die of the plurality of dies are electrically connected to an input of control signal shift registers and an input of the data signal shift registers, respectively, of a following die in the same die chain.

7. The semiconductor wafer of claim 1, wherein the test results are generated by comparing execution results of each of the plurality of dies with expected results in data signal shift registers of corresponding dies.

8. A semiconductor wafer comprising:
a plurality of dies, each of the plurality of dies comprising a radio frequency identification (RFID) tag circuit, the plurality of dies being serially and non-parallelly connected to each other to form a die chain;
a plurality of scribe regions, each of the plurality of scribe regions being interposed between corresponding adjacent dies;
a plurality of conductive lines disposed in the scribe regions, adjacent dies in the die chain being electrically coupled using at least one of the plurality of conductive lines; and
a test probe electrically coupled to the die chain using at least one of the plurality of conductive lines, the test probe comprising a plurality of probe pads, the plurality of probe pads being configured to transmit data signals and control signals through the die chain.

9. The semiconductor wafer of claim 8, wherein each of the plurality of dies further comprises a plurality of power planes configured to receive power signals from a previous die in the die chain and to transmit the power signals to a following die in the die chain, the plurality of power planes comprising at least one VDD plane and at least one ground plane.

10. The semiconductor wafer of claim 8, wherein the test probe further comprises a plurality of power planes configured to transmit power signals to the die chain, the plurality of power planes comprising at least one VDD plane and at least one ground plane.

11. The semiconductor wafer of claim 8, wherein each of the plurality of dies further comprises:
control signal shift registers configured to store the control signals; and
data signal shift registers configured to store the data signals.

12. The semiconductor wafer of claim 11, wherein the control signal shift registers are further configured to receive the control signals from a previous die in the die chain and transmit the control signals to a following die in the die chain.

13. The semiconductor wafer of claim 11, wherein the data signal shift registers are further configured to receive the data signals from a previous die in the die chain and transmit the data signals to a following die in the die chain.

14. The semiconductor wafer of claim 11, wherein each of the plurality of dies further comprises a comparator coupled to the control signal shift registers, the data signal shift registers and the RFID tag circuit, the comparator being configured to receive a comparison start signal from the control signal shift registers, test results from the RFID tag circuit and expected results from the data signal shift registers, and to transmit comparison results to the data signal shift registers.

15. A semiconductor wafer comprising:
a plurality of dies, each of the plurality of dies comprising a radio frequency identification (RFID) tag circuit, the plurality of dies being coupled to form a plurality of die chains; and
a test probe electrically coupled to the plurality of the die chains, the test probe being directly coupled to an individual die of the plurality of dies, the test probe being indirectly coupled to another individual die of the plurality of dies through the individual die, and the test probe comprising:
first probe pads, the first probe pads being configured to transmit data signals and control signals through the plurality of die chains; and
second probe pads, the second probe pads being configured to transmit power signals through the plurality of die chains.

16. The semiconductor wafer of claim 15, further comprising:
a plurality of scribe regions, each of the plurality of scribe regions being interposed between corresponding adjacent dies; and
a plurality of conductive lines disposed in the scribe regions, adjacent dies of each of the die chains being electrically coupled using at least one of the plurality of conductive lines.

17. The semiconductor wafer of claim 15, wherein the test probe further comprises a plurality of power planes coupled to the second probe pads, the plurality of power planes comprising at least one VDD plane and at least one ground plane.

18. The semiconductor wafer of claim 15, wherein each of the plurality of dies further comprises:
control signal shift registers coupled to the RFID tag, the control signal shift registers being configured to store the control signals transmitted through the first probe pads; and
data signal shift registers coupled to the RFID tag, the data signal shift registers being configured to store the data signals transmitted through the first probe pad.

19. The semiconductor wafer of claim 18, wherein each of the plurality of dies further comprises a comparator coupled to the control signal shift registers, the data signal shift registers and the RFID tag circuit, the comparator being configured to receive a comparison start signal from the control signal shift registers, test results from the RFID tag circuit and expected results from the data signal shift registers, and to transmit comparison results to the data signal shift registers.

20. The semiconductor wafer of claim 15, wherein the test probe further comprises third probe pads, the third probe pads being configured to transmit clock signals through the plurality of die chains.

* * * * *